(12) United States Patent
Husher

(10) Patent No.: US 7,002,187 B1
(45) Date of Patent: Feb. 21, 2006

(54) INTEGRATED SCHOTTKY DIODE USING BURIED POWER BUSS STRUCTURE AND METHOD FOR MAKING SAME

(75) Inventor: John Durbin Husher, Santa Clara, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 10/458,163

(22) Filed: Jun. 9, 2003

(51) Int. Cl.
H01L 29/74 (2006.01)
H01L 21/00 (2006.01)
H01L 21/28 (2006.01)

(52) U.S. Cl. .................. 257/109; 257/117; 257/127; 257/135; 438/92; 438/167; 438/175; 438/571; 438/574; 438/576; 438/578

(58) Field of Classification Search .......... 438/92, 438/140, 167, 175, 571, 574, 576, 578, 579; 257/109, 117, 127, 135
See application file for complete search history.

(56) References Cited

U.S. PATENT DOCUMENTS 6,518,152 B1 * 2/2003 Hshieh et al. .......... 438/570
6,566,733 B1 * 5/2003 Husher et al. .......... 257/557

2003/0022474 A1 * 1/2003 Grover et al. .......... 438/570

* cited by examiner

*Primary Examiner*—Hsien-Ming Lee
(74) *Attorney, Agent, or Firm*—Sawyer Law Group LLP

(57) ABSTRACT

An integrated Schottky diode and method of manufacture of such a diode is disclosed. In a first aspect, a Schottky diode comprises a semiconductor substrate. The semiconductor substrate includes an epitaxial layer (EPI) on the substrate region. The diode includes a plurality of guard rings in the EPI layer and a plurality of oxidized slots. Finally, the diode includes metal within the plurality of slots to form a Buried Power Buss. A portion of the metal is completely oxide isolated from the other elements of the diode. In a second aspect, a method for manufacturing a Schottky diode comprises providing a substrate region, A buried N+ region providing an epitaxial (EPI) layer. The method also includes providing a plurality of guard rings in the EPI layer and providing a plurality of slots in the semiconductor substrate that is in contact with the EPI layer and the substrate region. The method further includes a plurality of oxidizing the slots and providing metal within the plurality of slots to form a Buried Power Buss structure. A portion of the metal is completely oxide isolated from the other elements of the diode. Accordingly, the system and method in accordance with the present invention a Schottky diode is provided that has low forward drop, low leakage at low and high voltages, and has a high reverse breakdown voltage.

6 Claims, 7 Drawing Sheets

Buried Power Buss Schottky Making N+ Connection to N Side of Schottky via 1C, Metal through Slot with Oxide Removed from Bottom of Slot Standard Schottky with Metal Overlap of Metal Junction into High Resistivity N Material Cross Section of Standard Schottky with P+ Guard Rings Typical Isoplanar Cross Section of Standard Iosplanar Schottky without Guard Rings Cross Section Showing Oxidized Slots Cutting P+ Guard Ring,
Followed by Metal Layers for Buried Power Buss Termination Schottky Cross Section of Metal in Slots, (1A & 1B) including
Metal 1C which provides Schottky Metal, &
Patterned Interconnect Metal General Flow of Buried Power Buss
that includes Schottky Diode Buried Power Buss Schottky Making N+ Connection to N Side of Schottky via 1C, Metal through Slot with Oxide Removed from Bottom of Slot

INTEGRATED SCHOTTKY DIODE USING BURIED POWER BUSS STRUCTURE AND METHOD FOR MAKING SAME

FIELD OF THE INVENTION

The present invention relates generally to semiconductor devices and particularly to Schottky diodes.

BACKGROUND OF THE INVENTION

The ideal Schottky diode in an integrated circuit would be one with low forward drop, low leakage, low capacitance and high breakdown. In general, this dictates a large area device to obtain the low forward drop by lowering the resistance due to spreading resistance effects, contact resistance and some depletion edge resistance. However, the increase in size normally results in greater leakage, higher capacitance, and lower breakdown.

Leakage is the result of: 1) the large area required to reduce the resistance, 2) the resultant increase in edges, and depletion region of the larger junction, 3) surface effects caused by contamination that will normally increase due to the increase in area, 4) the sharp junction curvature to the surface that gives high reverse leakage at elevated voltages, 5) lower breakdown voltage, and 6) junction spreading as the voltage is increased, resulting in increased depletion region and its resultant increased leakage.

To offset these issues, it is common practice to invoke the following:

1) MOS-type practices must be used in the fabrication of the device in order to guarantee a good clean, non contaminated surface.

2) The metal on the oxide is overlapped over the metallic junction to provide a more ideal surface termination of the junction. (This is applicable at low operating voltages, but at higher voltages the sharp electrode edge will result in high leakage, as well as lowering the breakdown voltage. FIG. 1A illustrates a conventional Schottky diode 10 with a metal overlap 12. This metal overlap 12 improves the characteristics when relatively high reverse breakdown voltages are encountered. This is shown in FIG. 1B.)

3) The sharp electrode edge problem is reduced by having a guard ring 82 around the periphery of the metallic junction. FIG. 1B shows the guarding structure 82. This guard ring also prevents the spread of the depletion region and therefore the added depletion volume.

Another approach that reduces the junction curvature and therefore helps to reduce the leakage is using an oxide isolated approach using an isoplanar type oxide. FIG. 2 illustrates an isoplanar type Schottky diode 20. Note that the oxide curvature shown at 22 helps to soften the junction curvature and termination. This approach has some issues with leakage due to the junction tending to move out and therefore create a larger depletion region which increases the "capture" leakage. This approach therefore usually ends up with a guard ring around it to both soften the junction curvature plus prevent the spread of the depletion region.

Accordingly, what is needed is a system and method for providing an ideal Schottky diode that has a lower resistance, controlled capacitance and reduced leakage. The present invention addresses such a need.

SUMMARY OF THE INVENTION

An integrated Schottky diode and method of manufacture of such a diode is disclosed. In a first aspect, a Schottky diode comprises a semiconductor substrate. The semiconductor substrate includes a high resistivity N-type epitaxial layer (EPI) on the substrate region. The diode includes a plurality of guard rings in the EPI layer and a plurality of oxidized slots. Finally, the diode includes metal within the plurality of slots to form a Buried Power Buss (BPB). A portion of the metal is completely oxide isolated from the other elements of the diode as well as the rest of the active circuitry and passive circuitry within the integrated chip.

In a second aspect, a method for manufacturing an integrated Schottky diode comprises providing a substrate region and a buried N+ layer followed by a high resistivity N-type epitaxial (EPI) layer. The method also includes providing a plurality of guard rings in the EPI layer and providing a plurality of slots in the semiconductor substrate that is in contact with the EPI layer and the substrate region. The method further includes a plurality of oxidizing the slots and providing metal within the plurality of slots to form a Buried Power Buss structure. A portion of the metal is completely oxide isolated from the other elements of the diode as well as the other active and passive elements within the integrated structure. In this approach, oxide is removed from the bottom of slots over the buried layer to allow a row resistance contact to the buried layer. Accordingly, the system and method in accordance with the present invention a Schottky diode is provided that has low forward drop, low leakage at low and high voltages, has a restricted capacitance and has a high reverse breakdown voltage.

DETAILED DESCRIPTION

The present invention relates generally to semiconductor devices and particularly to integrated Schottky diodes. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1A:
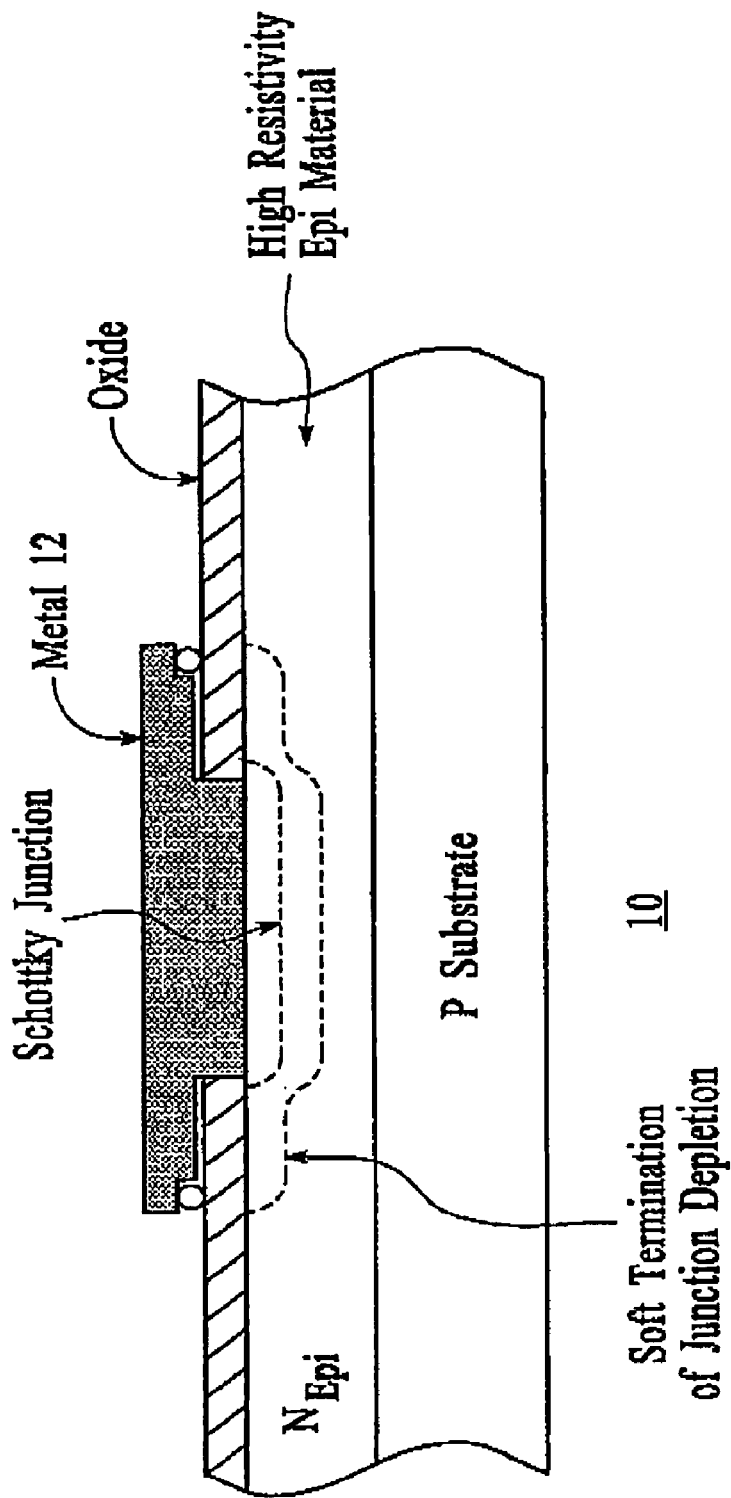
FIG. 1A illustrates a conventional Schottky diode with a metal overlap.
Figure 1B:
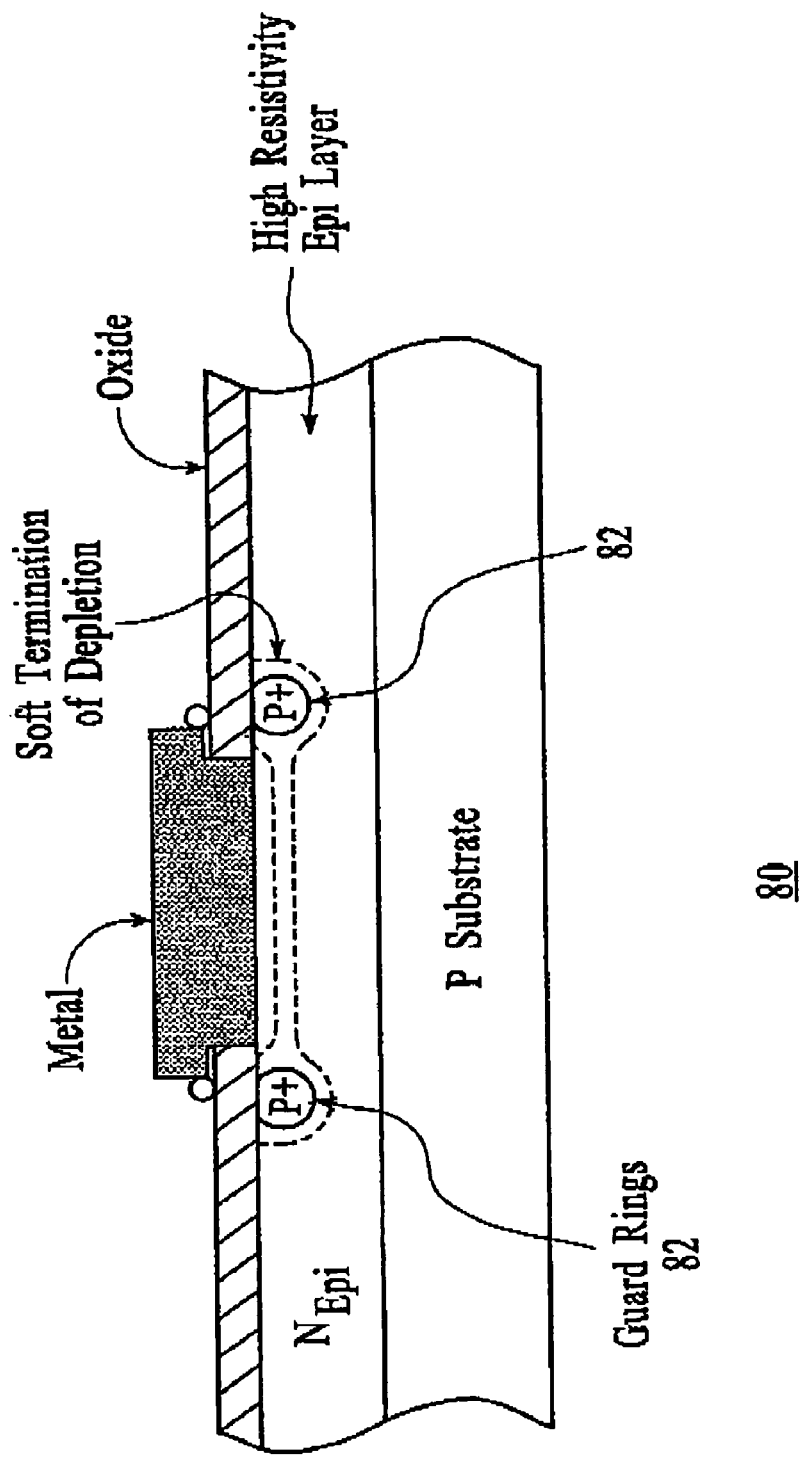
FIG. 1B illustrates a conventional Schottky diode with a guard ring.
Figure 2:
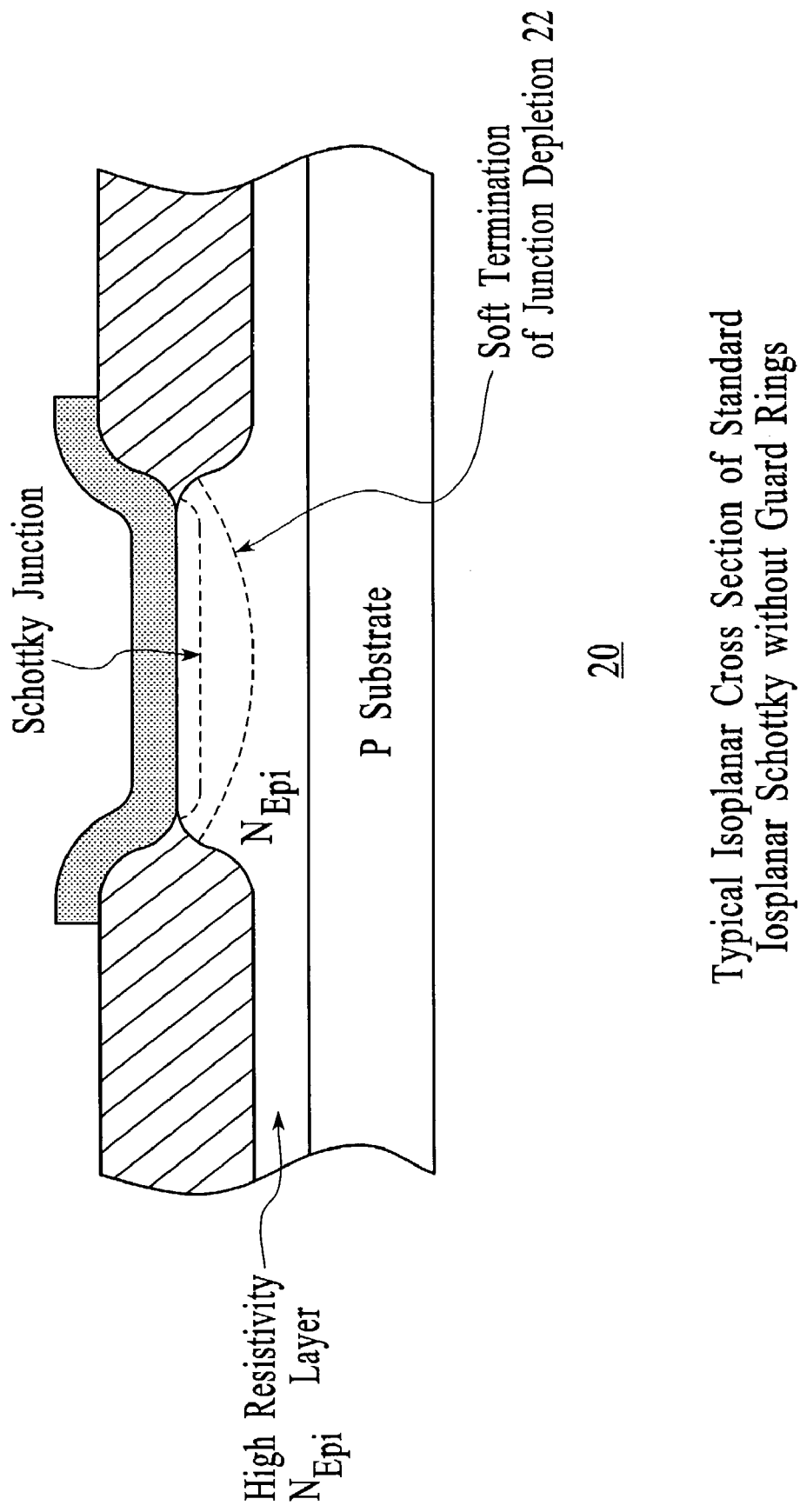
FIG. 2 illustrates an isoplanar type Schottky diode.

A system and method in accordance with the present invention utilizes the advantages described above in relation to the Schottky diodes of FIGS. 1–3 namely, it uses MOS type processing and surface improvement techniques to provide the proper surface; it uses overlapped Schottky metal; and it uses guard rings. Plus it adds another element—it is terminated by the buried power buss structure previously disclosed in U.S. patent application Ser. No. 10/034,184, entitled "Buried Power Buss Utilized for High Current, High Power Semiconductor Devices and a Method for Providing the Same," filed on Dec. 28, 2001 (2208P).

Figure 3:
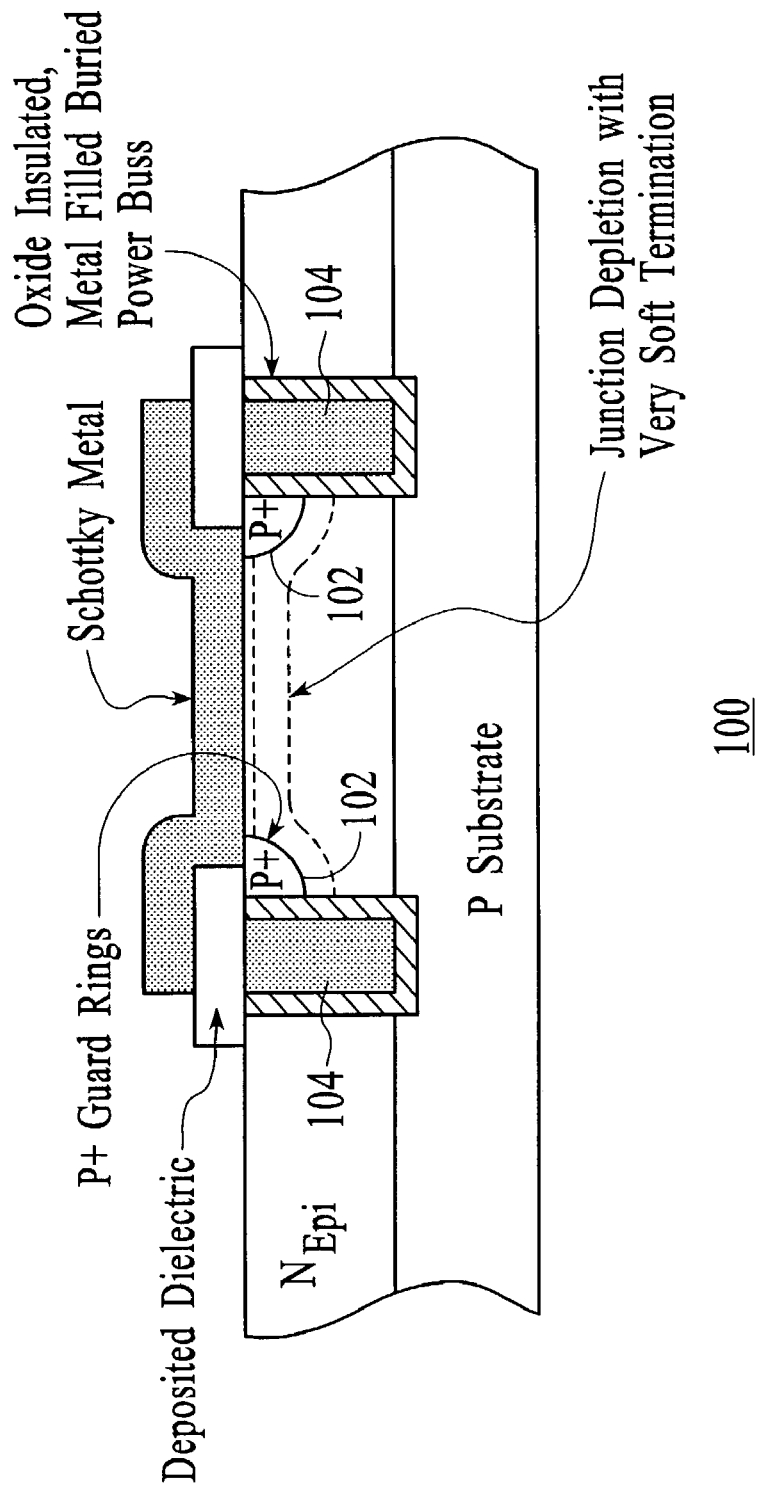
FIG. 3 illustrates a Schottky diode in accordance with the present invention.
Figure 4:
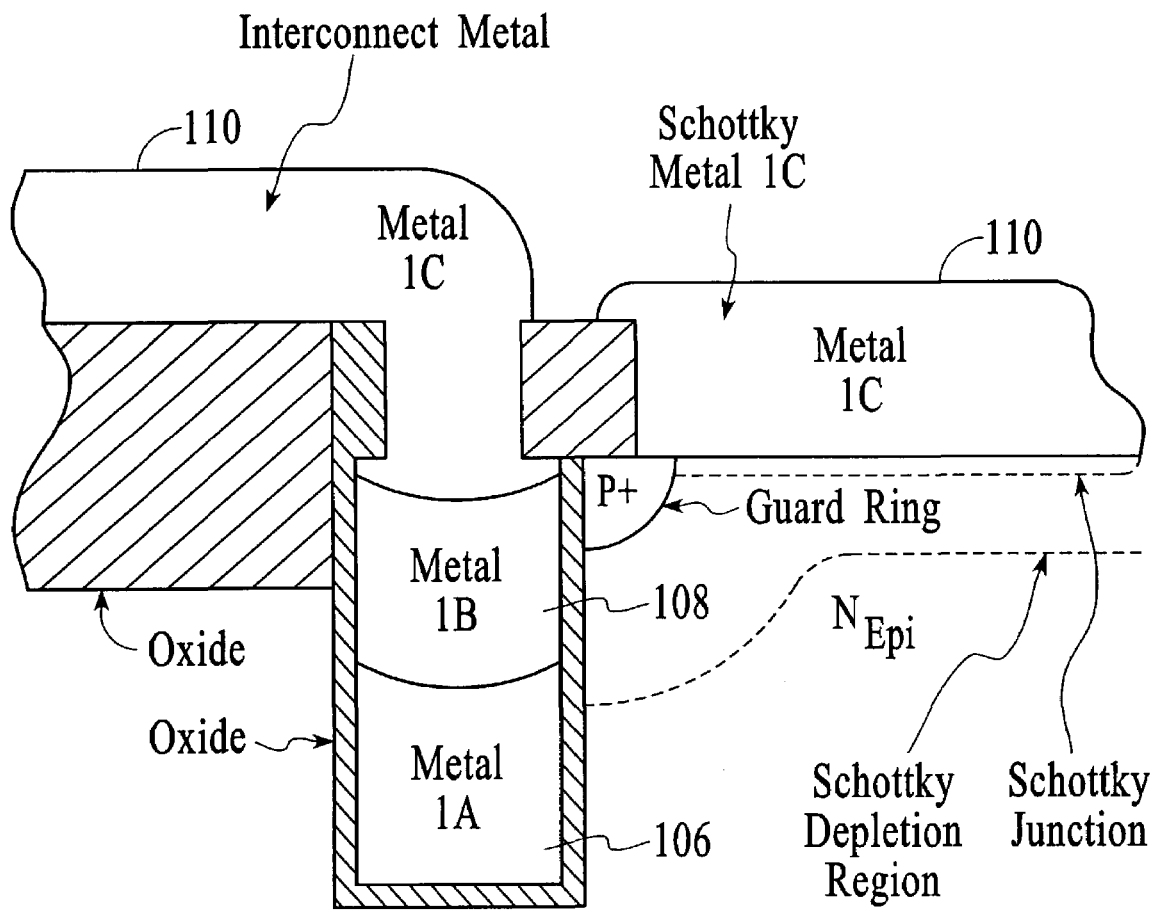
FIG. 4 illustrates a cross-section of a BPB-type of Schottky diode displaying the 1A, 1B and 1C metal structure in accordance with the present invention.

This use of the BPB and its metal within the slots results in the Schottky's metal junction's depletion region being terminated by the guard ring, which is then terminated by the slot oxide to provide an ideal horizontal field termination of the junction. This combination provides a Schottky that has low forward drop, low leakage at low and high voltages, and a high reverse breakdown voltage. The final structure is shown in FIGS. 3 and 4.

An integrated Schottky diode and method of manufacture of such a diode is disclosed. To achieve this integrated structure; a standard bipolar, CMOS, DMOS, or BCD process may be used incorporating the Buried Power Buss multi-metal structure and this integrated Schottky diode structure within any of these structures. One has to ensure the mask changes are incorporated for the P+ guard rings in any of these standard processes. The boron for these guard rings comes from the base of a bipolar process or the source drain of a P-channel device. The Junction isolation process is dropped and the sinker process is dropped, both of which are high-temperature and long time (high Dt) processes. These functions are supplied by the BPB process.

In a first aspect, a Schottky diode comprises a semiconductor substrate. The semiconductor substrate includes a high resistivity N-type epitaxial layer (EPI) on the substrate region. The wafers are processed using the standard bipolar, CMOS, DMOS, BCD process technology up to the point of applying the metal. (Since the BPB process is used, the isolation and sinker processes are eliminated.) At this point, slots are etched to provide the buried power buss for the overall device and the Schottky device. The slots cut for the Schottky have the edge of the slots cut through the middle of the guard ring, thus leaving intact the inner half of the guard ring closest to the Schottky diode (see FIGS. 3 and 4). This eliminates at least half of the cross-section of the guard ring diffusions thus reducing the capacitance these guard rings add to the structure. Reducing the cross-section of these guard rings also results in a smaller structure and reduces any leakage that may be attributed to these guard rings. The slots are oxidized and filled with a first metal deposition (1A). Resist is spun and the wafers are planarized and followed by resist strip, second metal is deposited (1B), resist is spun and the wafers are planarized again and resist is stripped.

These steps result in the slots being filled with metal and no metal in the field. A dielectric is deposited, such as TEOS, which covers the total integrated circuit including the metal in the slots. This is followed by opening of the standard contacts as well as the dielectric over the 1B metal where it is desired to have a triple layer of metal made up of the 1A, 1B, and 1C metal. This is followed by a third deposition of metal (1C) that ties the contacts together and provides the interconnect mask, as well as the metal for the Schottky diode. Thus, with only a single interconnect metal masking one receives essentially triple-layer metal. The three layers that make up the first metal provide a thick low resistance metal and ensure a low resistance for the Schottky diode.

A cross-section is shown in FIGS. 3 and 4. This structure provides a device that is a "stand alone" structure. It is completely isolated from the other structures of the integrated circuit. Any leakage would be due to improper surface processing. The reverse voltage breakdown would be as high as a structure made with a moat etched around it. The forward drop is very low due to the area of the device, (which is determined by design) and the thickness of the metal. In this case, the metal is very thick (approximately 5–15 microns thick). The capacitance does not vary as it does with other approaches that have the depletion spreading as a function of voltage. The oxide termination provided by the oxidized slot prevents the excursion of the surface function and the resulting capacitance and leakage associated with the expanding depletion. It is very important to recognize that this is a buried junction, i.e., the junction does not come up to the surface as other approaches may. A buried junction eliminates the leakage that normally occurs when the junction comes to the surface. This results in an inherently low leakage device.

This results in the metal being terminated by the truncated guard ring which is then terminated by oxide to provide an ideal horizontal field termination. This combination provides a Schottky diode that has low forward drop, low leakage at low and high voltages, and a high reverse breakdown voltage. A Schottky diode structure 100 in accordance with the present invention is shown in FIG. 4.

Figure 5:
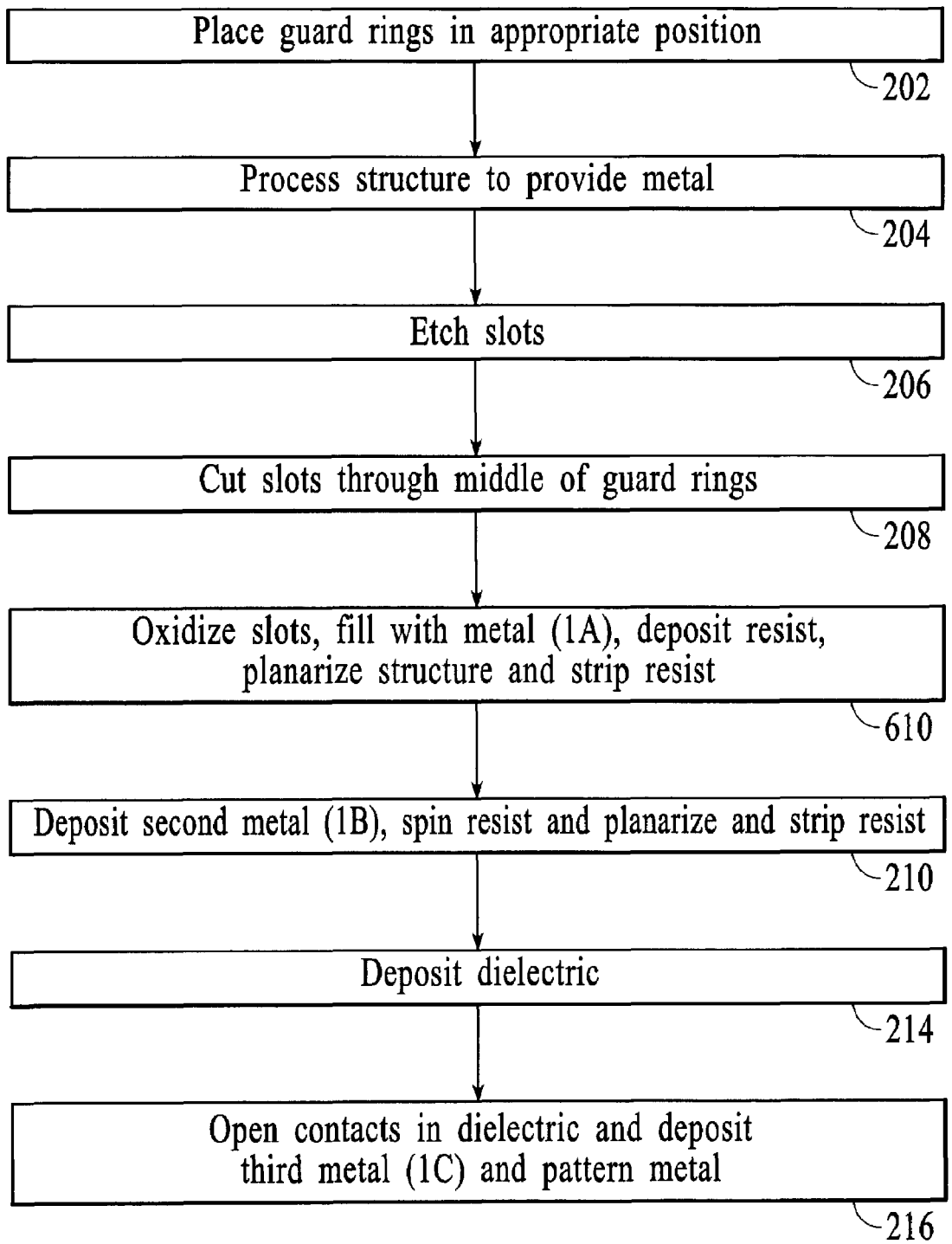
FIG. 5 is a flow chart for providing the Schottky diode structure of FIG. 4.

FIG. 5 is a general flow chart for providing the Schottky diode structure 100 of FIG. 4. To achieve this Schottky structure, a standard process including a BPB is used. However, the masks are made such that the P+ guard ring is put in the appropriate position in the structure (if one is not provided for in the standard process), via step 202 using any standard process that uses boron for the P+. This ensures no extra processing is required. The structure is then processed to the point of applying the metal, via step 204. At this point slots are etched to provide the buried power buss for the overall device, via step 206. The slots are cut such that the Schottky diode has the edge of the slots cut through the middle of the guard ring 102, via step 208. Thus the inner half of the guard ring closest to the Schottky junction is left intact. The slots are oxidized and filled with metal 1A 106, resist is spun and the structure is planarized and followed by resist strip, via step 210. This leaves the field void of metal and metal 1A in the bottom of the slots. Next, metal 1B 108 is deposited, resist is spun and the structure is planarized again and the resist is stripped, via step 212. A dielectric is deposited such as TEOS that covers the metal in the slots, thus buried slots are formed, via step 214.

Figure 6:
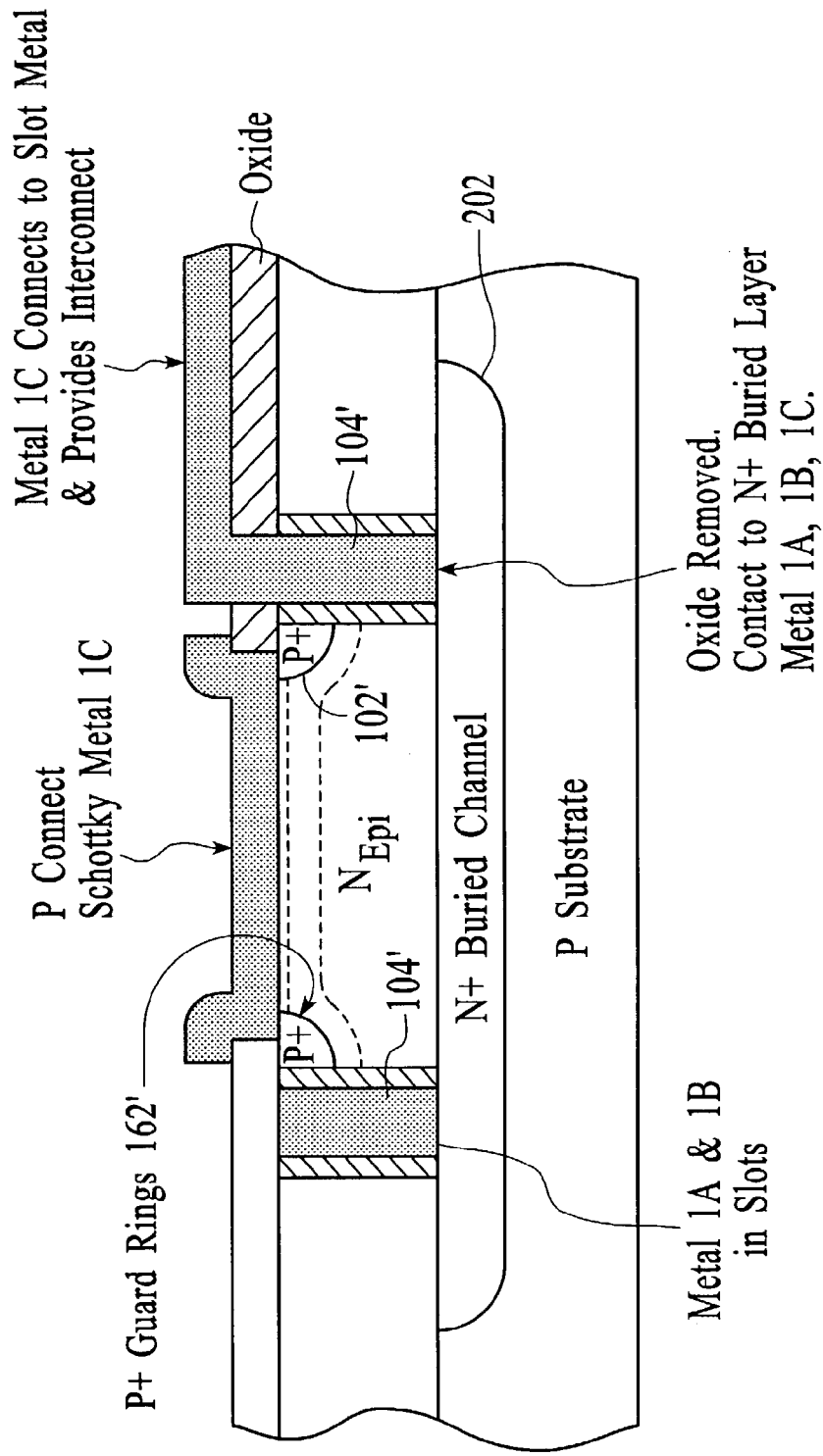
FIG. 6 illustrates a Schottky diode structure which includes a contact of the N type Buried Layer from the bottom of the slot.

Contacts are opened (including the Schottky metal site) and metal 1C is deposited and patterned, via step 216. All further steps are standard. The cross section of the Schottky diode is as shown in FIG. 6. It should be noted this method uses three depositions of metal with two of them buried. The third layer or the Schottky metal 110 is the only one that gets patterned and requires a masking step.

As is seen in this structure, the Schottky metal 110 is now a "stand alone" type structure. It is completely oxide isolated from the other elements of the integrated circuit. Any leakage would have to be the result of some integral portion of this isolated device. In this case, it would have to be a surface effect due to lack of proper procedures in providing a good clean surface for the Schottky metal 110. However, since this is a buried structure (the junction does not come to the surface) surface leakage should be eliminated. The reverse breakdown voltage would be as high as a structure made with a moat etched around it which insures a breakdown that is high since it is not limited by junction curvature. The forward drop is very low due to the area of the device; which is determined by design, and the thickness of the metal. The capacitance is an inverse function of the low resistive drop and is therefore not helped by this structure other than the fact that it is limited due to the truncating of the guard ring. It is not varying due to the junction spreading out on the interface as a function of oxide charge or surface voltage as happens with many Schottky diode structures. The oxide termination provided by the slot prevents the exclusion of the surface junction and the resulting capacitance and leakage associated with the expanding depletion region.

This structure provides many advantages. The Schottky diode is a majority carrier type of structure and is therefore normally void of any recovery type problems that exist with a normal junction. This makes it ideal for use in high speed digital circuits. However, when terminating the junction with a guard ring 102, this small portion of the diode junction can result in some charge storage and the resultant recovery time. The structure using the BPB process cuts the guard ring 102 to half or less of the original structure area and therefore reduces this issue. In addition to reducing the storage time, this reduction in guard ring 102 area results in reduction of the capacitance of the Schottky structure, which can be high due to the increase in size of the Schottky to reduce resistance.

Since a buried layer is standard, the Schottky diode could be fabricated over a buried layer. With this approach the oxide would be removed from the bottom of the slot 104 just after oxidizing the slots 104, at the same time the oxide is removed from the bottom of the slots for the ground slots. This would allow contact of the N type material 202 from the bottom of the slot 104' as shown in FIG. 6. This means the Schottky junction is a buried junction since where the junction appears is completely surrounded by oxide and this oxide integrity need not be broken to make contact to the N portion of the Schottky diode. This ensures the integrity of the junction since no portion of the junction comes to the original surface. Since most leakages of Schottky diodes are due to surface issues (oxide to silicon interface), this approach makes this a moot issue.

This structure provides some additional advantages. The Schottky diode is a majority carrier type of structure and is therefore normally void of any recovery-type problems that exist with a diffused junction. This makes it ideal for use in high-speed digital circuits. However, when terminating the junction with a guard ring, this small portion of the diode junction can result in some charge storage and the resultant recovery time which sows its response. The structure described here, using the buried power buss, cuts the guard ring to half or less of the original structure and therefore reduces this issue. In addition, a standard guard ring constitutes an additional capacitance to the Schottky structure due to the area increase. This approach reduces that particular element of this capacitance. Since a buried layer is the standard process used in the industry, this Schottky should be fabricated over a buried layer. With this approach, the oxide would be removed from the bottom of the slot just after oxidizing the slots, at the same time as the oxide is removed from the bottom of the slots, for the ground slots for the standard buried power buss approach region being used throughout this process. This would allow contact of the N-type material from the bottom of the slot, as shown in FIG. 6. This means the Schottky junction is a buried junction, since where the junction appears is completely surrounded by oxide and this oxide integrity need not be broken to make contact to the N-portion of the Schottky diode. This ensures the integrity of the junction, since no portion of the junction comes to the original surface. Since most leakages of Schottky diodes are due to surface issues (oxide to silicon interface), this approach makes this a moot issue.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing an integrated Schottky diode comprising:
   (a) providing a substrate region;
   (b) providing epitaxial (EPI) layer on the substrate region;
   (c) providing a plurality of guard rings in the EPI layer;
   (d) providing a plurality of slots in a substrate region that is in contact with the EPI layer in the substrate region;
   (e) oxidizing the plurality of slots; and
   (f) providing a plurality of metals within the plurality of slots to form a buried power buss, wherein a portion of the plurality of metals is completely oxide isolated from the other elements of the diode, wherein the plurality of metals comprises three deposited metals, wherein first and second metal depositions fill the plurality of slots followed by a deposited dielectric, wherein the deposited dielectric has contacts opened above the plurality of slots and a third deposited metal provides an interconnect layer wherein a third metal forms the interconnecting metal to circuit elements and a second deposited metal, and is oxide isolated from a remaining portion of Schottky diode, wherein the integrated Schottky diode has a high reverse voltage, low forward drop, low leakage and of limited capacitance.

2. The method of claim 1 wherein the guard ring is reduced due to the buried power buss.

3. The method of claim 1 wherein a buried layer is provided between the substrate region and the EPI layer.

4. A Schottky diode comprising:
   a substrate region;
   an epitaxial layer (EPI) on the substrate region;
   a plurality of guard rings in the EPI layer;
   a plurality of oxidized slots; and
   metal within the plurality of oxidized slots to form a buried power buss, wherein a portion of the metal is completely oxide isolated from other elements of the diode, wherein the plurality of metals comprises three deposited metals, wherein first and second metal depositions fill the plurality of slots followed by a deposited dielectric, wherein the dielectric has contacts opened above the plurality of slots, wherein a third deposited metal provides the metal for the Schottky structure, as well as an interconnect layer, wherein the third deposited metal forms the contacts to a circuit and the second deposited metal, and is oxide isolated from a remaining portion of the Schottky diode, wherein the diode has a high reverse voltage, low forward drop, low leakage and of limited capacitance.

5. The Schottky diode of claim 4 wherein the guard ring is reduced due to the buried power buss cutting off a large portion of the guard ring area.

6. The Schottky diode of claim 4 wherein a buried layer is provided between the substrate region and the EPI layer.

* * * * *